(12) United States Patent
Milewski et al.

(10) Patent No.: US 10,996,273 B2
(45) Date of Patent: May 4, 2021

(54) TEST GENERATION USING TESTABILITY-BASED GUIDANCE

(71) Applicant: Mentor Graphics Corporation, Wilsonville, OR (US)

(72) Inventors: Sylwester Milewski, Nowe Miaste Lubawskie (PL); Janusz Rajski, West Linn, OR (US); Yu Huang, West Linn, OR (US)

(73) Assignee: Siemens Industry Software Inc., Plano, TX (US)

( * ) Notice: Subject to any disclaimer, the term of this patent is extended or adjusted under 35 U.S.C. 154(b) by 25 days.

(21) Appl. No.: 16/360,419

(22) Filed: Mar. 21, 2019

(65) Prior Publication Data

US 2019/0293718 A1 Sep. 26, 2019

Related U.S. Application Data

(60) Provisional application No. 62/646,507, filed on Mar. 22, 2018.

(51) Int. Cl.
*G01R 31/3185* (2006.01)
*G06F 17/18* (2006.01)
*G01R 31/3183* (2006.01)
*G01R 31/327* (2006.01)

(52) U.S. Cl.
CPC ........... *G01R 31/318547* (2013.01); *G01R 31/318335* (2013.01); *G01R 31/318583* (2013.01); *G06F 17/18* (2013.01)

(58) Field of Classification Search
None
See application file for complete search history.

(56) References Cited

U.S. PATENT DOCUMENTS

| 5,748,497 | A | * | 5/1998 | Scott | ............... G01R 31/31835 |
| | | | | | 702/123 |
| 6,327,687 | B1 | | 12/2001 | Rajski et al. | |
| 6,353,842 | B1 | | 3/2002 | Rajski et al. | |
| 6,539,409 | B2 | | 3/2003 | Rajski et al. | |
| 6,543,020 | B2 | | 4/2003 | Rajski et al. | |
| 6,557,129 | B1 | | 4/2003 | Rajski et al. | |
| 6,684,358 | B1 | | 1/2004 | Rajski et al. | |
| 6,708,192 | B2 | | 3/2004 | Rajski et al. | |

(Continued)

OTHER PUBLICATIONS

Yang et al., Detection of Internal Stuck-open Faults in Scan Chains, IEEE, Conference Paper, Pertinent pp. 1-10 (Year: 2008)*

(Continued)

*Primary Examiner* — April Y Blair
*Assistant Examiner* — Dipakkumar B Gandhi

(57) ABSTRACT

Constant-output-value gates and buffer gates are determined for gates in a circuit design based on a hold-toggle pattern. The hold-toggle pattern determines in which shift clock cycles in a segment of consecutive shift clock cycles one or more scan chains receive bits based on corresponding bits of a test pattern or same bits as bits of previous shift clock cycles during a shift operation. Activation probabilities and observation probabilities are then determined for circuit nodes of the circuit design based at least in part on the constant-output-value gates and the buffer gates. Finally, test patterns are generated based on the activation probabilities and the observation probabilities.

18 Claims, 16 Drawing Sheets

Flow chart 800

(56) References Cited

U.S. PATENT DOCUMENTS

| | | |
|---|---|---|
| 6,829,740 B2 | 12/2004 | Rajski et al. |
| 6,874,109 B1 | 3/2005 | Rajski et al. |
| 7,093,175 B2 | 8/2006 | Rajski et al. |
| 7,111,209 B2 | 9/2006 | Rajski et al. |
| 7,260,591 B2 | 8/2007 | Rajski et al. |
| 7,263,641 B2 | 8/2007 | Rajski et al. |
| 7,478,296 B2 | 1/2009 | Rajski et al. |
| 7,493,540 B1 | 2/2009 | Rajski et al. |
| 7,500,163 B2 | 3/2009 | Rajski et al. |
| 7,506,232 B2 | 3/2009 | Rajski et al. |
| 7,509,546 B2 | 3/2009 | Rajski et al. |
| 7,523,372 B2 | 4/2009 | Rajski et al. |
| 7,653,851 B2 | 1/2010 | Rajski et al. |
| 2007/0293998 A1* | 12/2007 | Underdal ............ G06N 5/02 701/31.4 |
| 2008/0195346 A1* | 8/2008 | Lin ............ G01R 31/318575 702/119 |
| 2009/0177935 A1* | 7/2009 | McLaurin ........ G01R 31/31858 714/729 |
| 2011/0099442 A1* | 4/2011 | Hales ............ G01R 31/318533 714/729 |
| 2012/0047413 A1* | 2/2012 | Chung ........... G01R 31/318555 714/731 |
| 2012/0272110 A1* | 10/2012 | Rajski .............. G01R 31/31721 714/726 |
| 2015/0323597 A1* | 11/2015 | Rajski ............ G01R 31/318563 714/727 |
| 2019/0293713 A1* | 9/2019 | Rajski ................ G01R 31/3172 |

OTHER PUBLICATIONS

Lai et al., On-Chip Test Generation Mechanism for Scan-Based Two-Pattern Tests, IEEE, Conference Paper, pp. 251-256. (Year: 2008).*

A. Kumar, et al., "Isometric test compression," IEEE Trans. CAD, vol. 34, pp. 1847-1859, Nov. 2015.

J. Rajski, J. Tyszer, M. Kassab, and N. Mukherjee, "Embedded deterministic test," IEEE Trans. CAD, vol. 23, pp. 776-792, May 2004.

D. Czysz, G. Mrugalski, J. Rajski, and J. Tyszer, "New test data decompressor for low power applications," Proc. DAC, 2007, pp. 539-544.

* cited by examiner

|    | Conventional scan | | | Designs with EDT logic | | Hypercompression (HTL) | |
|----|-----------|---------------|-----------|-----------|--------|-----------|--------|
|    | Sequential | Combinational | Total | Total | $\Delta_S$ | Total | $\Delta_H$ |
| C1 | 462,205 (0.54) | 724,627 (0.85) | 1,186,839 (1.39) | 1,197,765 (1.40) | 0.92% | 1,200,893 (1.41) | 1.18% |
| C2 | 749,037 (0.88) | 1,057,120 (1.24) | 1,806,157 (2.12) | 1,812,503 (2.13) | 0.35% | 1,814,766 (2.13) | 0.48% |
| C3 | 213,204 (0.25) | 71,419 (0.08) | 284,623 (0.33) | 286,439 (0.33) | 0.64% | 287,191 (0.34) | 0.90% |
| C4 | 713,196 (0.83) | 1,614,419 (1.89) | 2,327,615 (2.72) | 2,335,625 (2.73) | 0.34% | 2,338,450 (2.74) | 0.46% |

FIG. 6 for each gate *g* with one input set to a controlling value do
   trace backward from each non-controlling input of *g*
   if all fan-out branches of a visited gate *v* are blocked
     gate *v* is blocked
     trace all inputs of *v*
   else
     stop tracing the branch leading to *v*
if gate *g* is blocked in both simulations
  gate *g* is always blocked
set observability of *g* to 0

1300

```
for each hold segment do
   set all segment's scan cells to 0
   run logic simulation
   find all blocked gates G_0
   set all segment's scan cells to 1
   run logic simulation
   find all blocked gates G_1
for each gate g whose output is either 0 or 1 do
   if gate g has the same value in both simulations then
      replace g with a constant-output-value gate
   else
      replace g with a buffer gate
```

1400

TEST GENERATION USING TESTABILITY-BASED GUIDANCE

RELATED APPLICATIONS

This application claims the benefit of U.S. Provisional Patent Application No. 62/646,507, filed on Mar. 22, 2018, titled "Test Generation Using Testability-Based Guidance," and naming Sylwester Milewski et al. as inventors, which application is incorporated entirely herein by reference.

FIELD OF THE DISCLOSED TECHNIQUES

The presently disclosed techniques relates to circuit testing. Various implementations of the disclosed techniques may be particularly useful for increasing test compression ratio while reducing test power dissipation.

BACKGROUND OF THE DISCLOSED TECHNIQUES

Test data compression has become instrumental in reducing the overall cost of test. Typically, this technology deploys an external tester to deliver compressed test patterns through a small number of channels, and on-chip decompressors to expand them into scan-compatible data. The first test compression schemes, such as broadcast scan, Illinois scan, Virtual Scan, or adaptive scan, do not make a distinction between ATPG (Automatic Test Pattern Generation) and compression. They work with hardwired decompressors defining either temporary or permanent equivalence of scan cells. Consequently, if a scan cell is assigned by ATPG, its value is copied to all equivalent scan cells, which effectively eradicates a separate encoding phase. The next-generation solutions, such as combinational compression and static as well as dynamic LFSR (Linear Feedback Shift Register) reseeding, use a variety of techniques to encode ATPG-produced partially specified test cubes. For example, the embedded deterministic test (EDT) employs a solver of linear equations to derive compressed data (seeds). Early test generation techniques within this class are unaware of a decompressor architecture and its implications on ATPG performance. One of the first steps to change this trend was to combine LFSR seed computation with ATPG-based justification of certain decision nodes.

To reduce test power dissipation, test data encoding schemes should also allow test patterns with low switching activity to be loaded to scan chains. If don't-care bits are filled with random values, then scan toggling can consume much more power than a circuit is rated for. Similarly, the bulk of test power consumption can also be attributed to capture and unloading of test responses. As a result, the power dissipation in the test mode can increase by a factor of 2 to 3 compared to the functional mode, and is only expected to worsen, leading to supply voltage noise or overheating. This can cause a device malfunction, loss of yield, chip reliability degradation, shorter product lifetime, or a device permanent damage.

With the exception of test data reduction, the performance characteristics of low-power test solutions are very different. Some schemes rely on enhanced LFSR reseeding techniques. For example, outputs of two LFSRs can be AND-ed or OR-ed to decrease the amount of switching. Test cubes can also be divided into blocks, and only those with transitions encoded by reseeding. Alternatively, one can freeze a decompressor in certain states and load scan chains with patterns having low transition counts. A low power decompressor used in parallel with a power-aware controller allows further reduction of scan toggling. Several solutions adapted by low-power compression schemes have debuted as stand-alone methods. Typically, they assign non-random values to unspecified bits of test cubes which can otherwise cause power violations. Don't-care bits may also assume values minimizing the number of transitions during scan-in shifting. The resultant test sequences can be run-length encoded. As another option, a minimum transition fill may replicate the value of the most recent care bit. California scan and vector modification use similar techniques. A minimum transition fill scheme uses bit stripping to determine unspecified positions and fill them accordingly to reduce transitions. Other switching-aware filling techniques decrease the capture power by assigning unspecified bits with values that can minimize the number of transitions at the outputs of scan cells in the capture mode.

An isometric test data compression approach, described in A. Kumar, et al., "Isometric test compression," IEEE Trans. CAD, vol. 34, pp. 1847-1859, November 2015, enables more interactions between test generation (ATPG) and test encoding. If f is a test pattern fill rate, then this new paradigm attempts to elevate compression ratios to values well beyond 1/f i.e., above what is achievable through the best conventional reseeding techniques. The isometric compression deploys an on-chip power-aware test data decompressor in conjunction with a compression-friendly ATPG. This allows loading scan chains with low-transition patterns while successfully encoding a significantly large number of specified bits.

The integration of the industrial test flow with the isometric compression has confirmed the predicted advantages, especially in terms of compression ratios and power consumption. Nevertheless, there are challenges in implementing certain parts of the original isometric decompressor in complex designs in new technology nodes. In particular, template (control) registers used for original isometric decompressor need to match the size of the longest scan chains comprising hundreds of flip-flops. Because of this size, the template registers can only be reloaded with extra regular patterns. To justify this cost, both in terms of test data volume and test time, every single template has to be reused for many patterns. This, in turn, reduces flexibility of the isometric compression. Since the scheme works exclusively with low-power patterns affecting all scan chains, it may also compromise test coverage, if some faults need individually elevated fill rates in certain scan chains, which test templates may not be able to guarantee.

BRIEF SUMMARY OF THE DISCLOSED TECHNIQUES

Various aspects of the disclosed technology relate to generating test patterns for isometric test compression. In one aspect, there is a method, executed by at least one processor of a computer, comprising: determining constant-output-value gates and buffer gates for gates in a circuit design based on a hold-toggle pattern, wherein each of the constant-output-value gates represents one or more gates in the circuit design, each of the buffer gates represents one or more gates in the circuit design, and the hold-toggle pattern determines in which shift clock cycles in a segment of consecutive shift clock cycles one or more scan chains receive bits based on corresponding bits of a test pattern or same bits as bits of previous shift clock cycles during a shift operation; determining activation probabilities and observation probabilities for circuit nodes of the circuit design based at least in part on the constant-output-value gates and the buffer gates; and generating test patterns based on the activation probabilities and the observation probabilities.

The generating test patterns may comprise: using the activation probabilities and the observation probabilities as guidance for determining fault activation and propagation paths. Alternatively or additionally, the generating test patterns may comprise: reordering faults based on the activation probabilities and the observation probabilities. The reordering faults may comprise: determining first testability values of the faults without considering the hold-toggle pattern; determining second testability values of the faults based on the activation probabilities and the observation probabilities; and changing a sequence of faults for test cube generation based on comparing the first testability values with the second testability values.

The determining constant-output-value gates and buffer gates may comprise: determining blocked gates in the circuit design based on the hold-toggle pattern.

The generating test patterns may comprise generating compressed test patterns. The compressed test patterns may be test patterns encoded for EDT (embedded deterministic test)-based decompressors.

In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 6 shows a table of the silicon real estate taken up by HTL in terms of equivalent area of 2-input NAND gates (measured also in $mm^2$) for 4 industrial circuits (C1-C4).

DETAILED DESCRIPTION OF THE DISCLOSED TECHNIQUES

General Considerations

Various aspects of the disclosed technology relate to generating test patterns for isometric compression. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "generate" and "determine" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
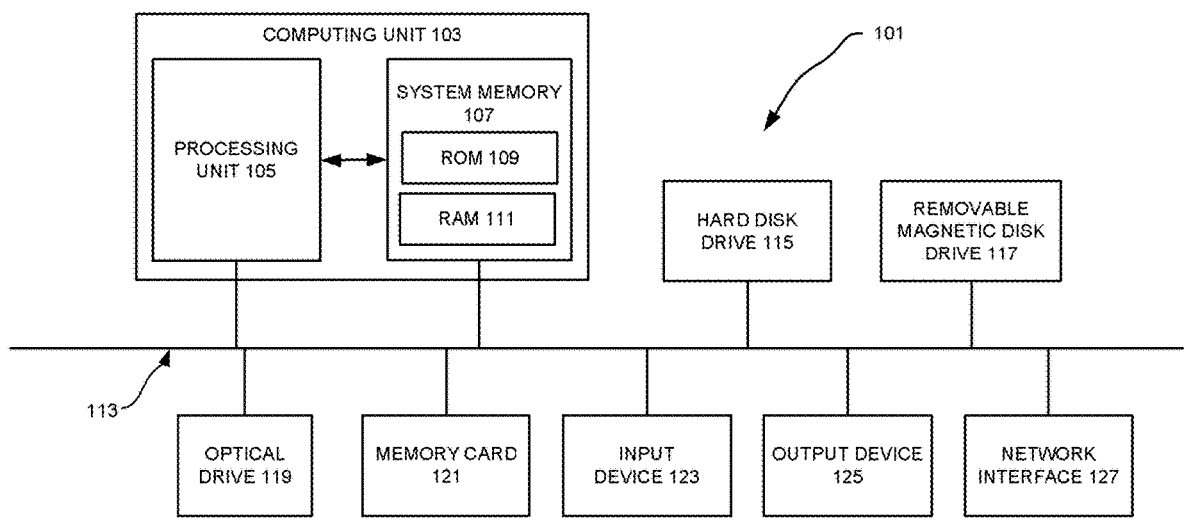
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design for Test, Test Pattern Generation, and Testing

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is a flaw or physical imperfection caused in a device during the manufacturing process. A fault model (or briefly a fault) is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can not only reduce the amount of data stored on the tester but also reduce the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539, 409; 6,543,020; 6,557,129; 6,684,358; 6,708,192; 6,829, 740; 6,874,109; 7,093,175; 7,111,209; 7,260,591; 7,263, 641; 7,478,296; 7,493,540; 7,500,163; 7,506,232; 7,509, 546; 7,523,372; 7,653,851, of which all are hereby incorporated herein by reference.

Logic built-in self-test (logic BIST) is a DFT technique that permits a circuit to test itself using embedded test logic without the need of an external tester. Classical logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-random pattern generator (PRPG), a commonly used test pattern generator, can be constructed from a linear feedback shift register (LFSR) or a cellular automation. To increase the fault coverage, a weighted LFSR may be employed. Another approach is to combine random test patterns with deterministic patterns in some fashion as the BIST logic can be used to handle compressed test patterns that are generated deterministically and stored on chip.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Flexible Isometric Decompressor System

Figure 2:
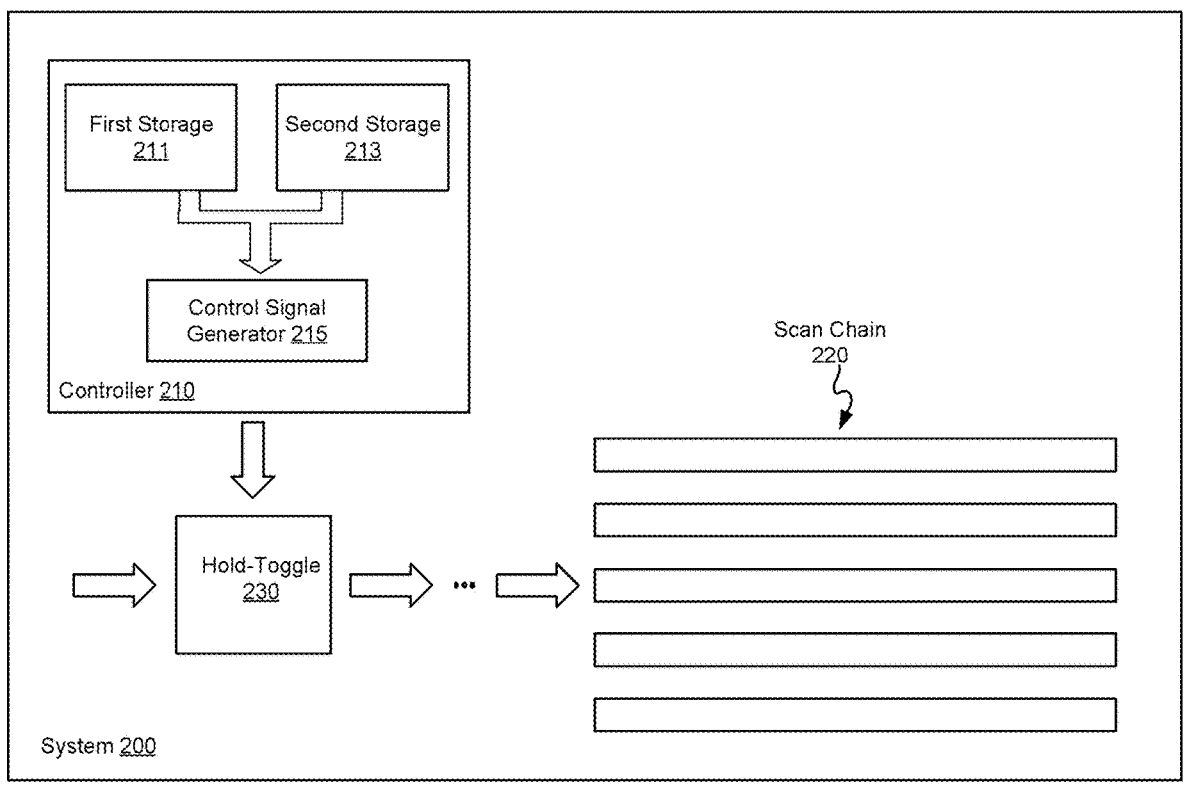
FIG. 2 illustrates an example of a test compression system 200 according to various embodiments of the disclosed technology.

FIG. 2 illustrates an example of a test compression system 200 according to various embodiments of the disclosed technology. The system 200 comprises a controller 210, scan chains 220, and hold-toggle circuitry 230. The scan chains 220, comprising scan cells, are configured in a test mode to shift in test patterns, apply the test patterns to the circuit, capture test responses of the circuit, and shift out the test responses. The controller 210 comprises first storage circuitry 211, second storage circuitry 213, and a control signal generator 215. The first storage circuitry 211 comprises circuitry for storing operational mode information. The operational mode information determines in which mode (a full-toggle mode or a hold-toggle mode) a scan chain operates when a test pattern is being shifted into the scan chains. A scan chain operating in the full-toggle mode receives bits based on corresponding bits of the test pattern. A scan chain operating in the hold-toggle mode receives bits based on corresponding bits of the test pattern (toggling) only in a predetermined number of inconsecutive shift clock cycles and constant bits (holding) in the rest of shift clock cycles for shifting the test pattern into the scan chains. The operational mode information may be delivered to the first storage circuitry 211 from an on-chip or off-chip storage place, or by a processor or by ATE.

The second storage circuitry 213 comprises circuitry for storing information of a hold-toggle pattern. The information of the hold-toggle pattern may be delivered to the second storage circuitry 213 from an on-chip or off-chip storage place, or by a processor or by ATE. The hold-toggle pattern determines in which shift clock cycles in a segment of consecutive shift clock cycles scan chains operating in the hold-toggle mode receive bits based on corresponding bits of the test pattern when a test pattern is being shifted into the scan chains. The hold-toggle pattern repeats multiple times during the scan shift period. For example, the longest scan chain has 600 scan cells. Accordingly, 600 shift clock cycles are needed to load a test pattern into the scan chains. The hold-toggle pattern covers 30 shift clock cycles and thus repeats 20 times during the scan shift period. The control signal generator 215 is configured to generate control signals based on the operational mode information and the hold-toggle pattern.

The hold-toggle circuitry 230 is configured to allow, according to the control signals received from the controller 210, some scan chains in the scan chains to operate in the full-toggle mode and some other scan chains in the scan chains to operate in the hold-toggle mode when the test pattern is shifted into the scan chains.

Figure 3:
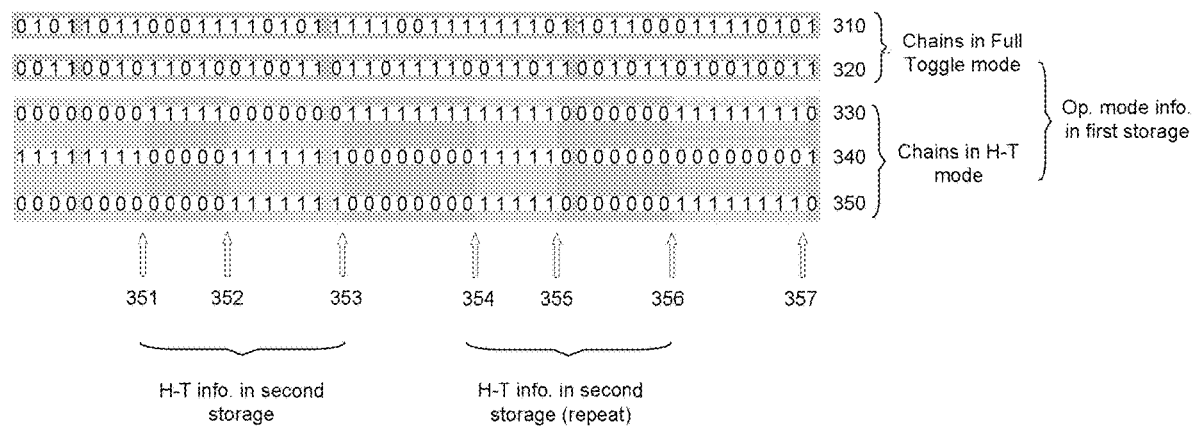
FIG. 3 illustrates an example of test pattern bits shifted into scan chains using the test compression system shown in FIG. 2.

FIG. 3 illustrates an example of test pattern bits shifted into scan chains using the system 200. Here, scan chains 310 and 320 operate in the full toggle mode whereas scan chains 330, 340, and 350 operate in the hold-toggle mode. As can be seen in the figure, bits in the scan chains 310 and 320 have no apparent regular patterns, changing according to the original test pattern. Those in the scan chains 330, 340, and 350, however, show consecutive "1s" alternating with consecutive "0s". The figure shows seven toggle points 351-357, where bits in the scan chains 330, 340, 350 may flip. Whether or not to flip depends on what is the next bit according to the original test pattern. If the upcoming bit is the same as the current one, then no toggle occurs such as the toggle point 354 on the scan chain 330, the toggle point 356 on the scan chain 340, and the toggle point 351 on the scan chain 350. Otherwise, the bit is flipped or inverted at the toggle points. Another feature shown in FIG. 3 is the three toggle points 351-353 form a set of toggle points, specifying a hold-toggle pattern along with the hold points. This hold-toggle pattern repeats itself for the next three toggle points 354-356. In fact, the last toggle point 357, like the toggle point 354, is a repeat of the toggle point 351.

Figure 4:
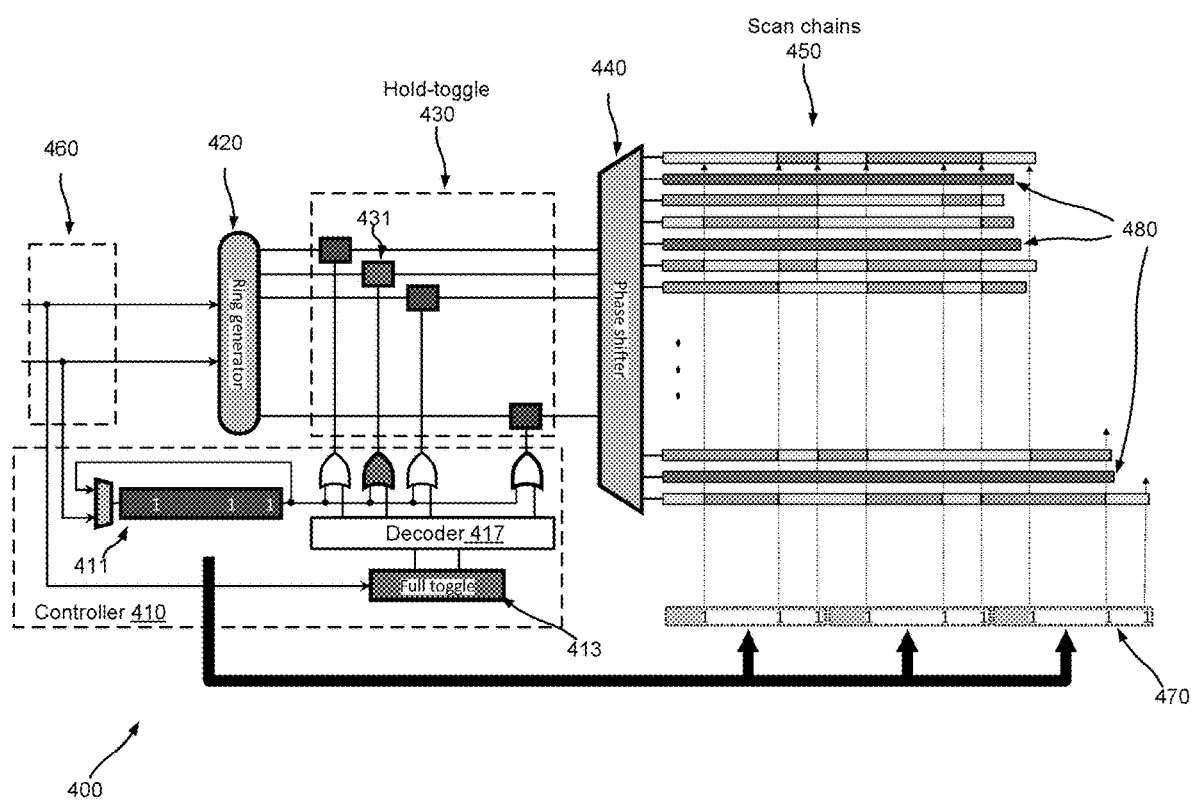
FIG. 4 illustrates an example of a block diagram of an EDT-based test compression system according to some embodiments of the disclosed technology.

FIG. 4 illustrates an example of a block diagram of an EDT-based test compression system 400 according to some embodiments of the disclosed technology. The EDT-based test compression system 400 comprises scan chains 450, a controller 410, hold-toggle circuitry 430, input circuitry 460, and a decompressor comprising a ring generator 420 and a phase shifter 440. The ring generator 420 may also be referred to as a continuous-flow ring generator. It can decode compressed test pattern data with every scan shift clock cycle. The phase shifter 440 can mix and expand outputs of the ring generator 420 to drive the scan chains 450. In the EDT-based system 400, the hold-toggle circuitry 430 is inserted between the ring generator 420 and the phase shifter 440. The hold-toggle circuitry 430 comprises subunits, of which each is coupled to an output of the ring generator 420 and is controlled by a control signal bit outputted by the controller 410. As noted previously, the subunit can be implemented by a latch with a multiplexer. Based on the control signal bit which may vary at some shift clock cycles, a subunit can either keep its content (hold) or be updated by the ring generator 420 (toggle). A time point when the ring generator 420 updates a subunit is called a toggle point. The controller 410 comprises a circular shift register 411 storing a hold-toggle pattern specifying the toggle points, a register 413 storing operational mode information, and a decoder 417 decoding the operational mode information. The outputs of the circular shift register 411 and the decoder 417 are combined by a set of OR gates to generate the control signal bits. The input circuitry 460 may comprise switching circuitry which connects inputs to the controller 410 when the input signals contain the hold-toggle pattern and/or the operational mode information or to the ring generator 420 when the input signals contain a compressed test pattern.

The small sizes of both the circular shift register 411 and the register 413 allow them to be updated frequently, even per pattern, without significantly affecting test time. For example, the input circuitry 460 may comprise state elements. The hold-toggle pattern and/or the operational mode information may be combined with compressed test pattern bits. If the longest scan chain needs 500 clock cycles to be fully loaded, the next four clock cycles may be used to load the state elements in the input circuitry 460 with the hold-toggle pattern and/or the operational mode information, which can then be transported to the controller 410 for controlling the loading of the next test pattern. Here, less than 1% of the shift clock cycles are allocated to loading the controller 460.

FIG. 4 also shows that a subunit 431 in the hold-toggle circuitry 430 is set to be "transparent"—allowing the corresponding output of the ring generator to feed the phase shifter 440 directly, and that the other subunits update their contents according to toggle points specified by the hold-toggle pattern. As such, three scan chains 480 operate in the full-toggle mode and the rest of the scan chains 450 operate in the hold-toggle mode. Between two successive toggle points is a hold segment. Locations of all toggle points form a test template, of which a portion (470) is illustrated in the figure. As can be seen, the hold-toggle pattern repeats three times in the portion of the test template 470.

It should be noted that the system 400 shown in FIG. 4 is just one example. A person of ordinary skill in the art will appreciate that various different configurations/circuits can be used to implement the system 400. For example, the ring generator may be replaced with an LFSR for LFSR-reseeding-based decompression, or a device comprising a plurality of multiplexers for broadcast-based decompression. The controller 410 may also comprise a second pair of decoder 417 and register 413 to allow two inputs of the phase shifter 440 to feed full-toggle scan chains.

A system according to various embodiments of the disclosed technology can shift low-entropy (low-toggling) test patterns into scan chains. Experimental evidences derived using some implementations of the disclosed technology indicate that it typically suffices to have at most two hold latches in the hold-toggle circuitry of the system operating in a transparent mode. This means about a dozen or less scan chains operate in the full-toggle mode during scan shift. A large design typically has a couple of hundred or even a few thousand scan chains. As a result, a large portion of the scan chains receive low toggling bit sequences, and power dissipation can be significantly reduced when a test pattern is shifted into the scan chains.

Figure 5:
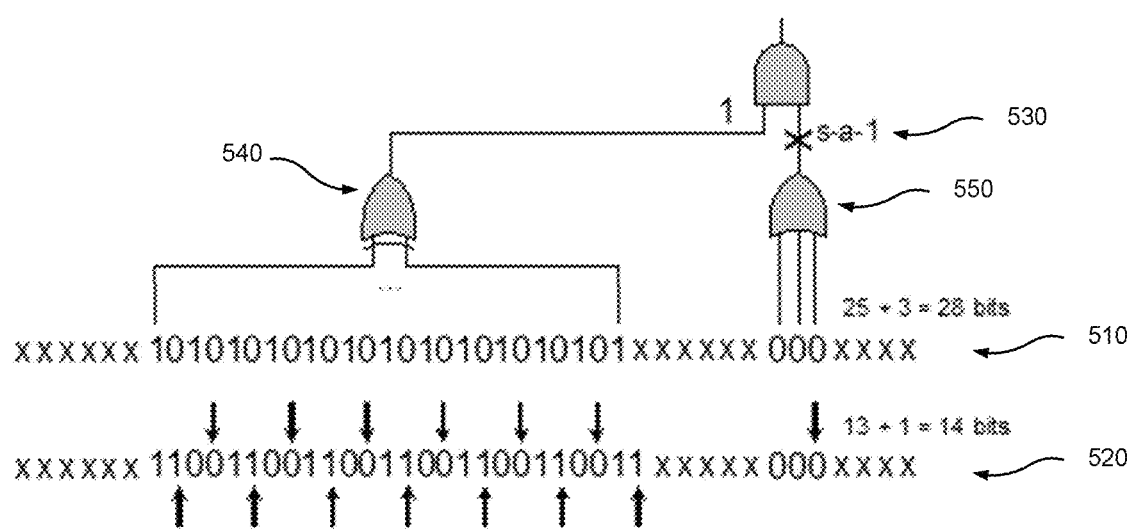
FIG. 5 illustrates an example of isomeric compression which may be implemented by various embodiments of the disclosed technology.

The disclosed technology can achieve high test compression even with low-entropy patterns. First, the number of care bits (specified bits) does not have to constrain neither compression nor a desired low toggling. On the contrary, having several cells assigned the same value and hosted by the same chain may actually ease problems related to both test data reduction and switching activity. Indeed, only specified bits occurring at certain locations would be then encoded in some of the compression schemes, while bits of the same value make it possible to deliver identical test data to scan chains for a number of shift cycles, thereby reducing the resultant toggling. FIG. 5 illustrates an example of isomeric compression which may be implemented by various embodiments of the disclosed technology. A test cube 510 detects a stuck-at-1 fault 530 by feeding a 25-input XOR gate 540 and a 3-input OR gate 550. Alternatively, one can apply a test cube 520. The number of specified bits that have to be encoded within the test cube 510 is equal to 25+3=28, whereas it suffices to target only 13+1=14 care bits to encode the test cube 520. Here, the specified pairs "00" and "11" can be obtained by encoding just the first value of each pair (indicated by arrows) and then sustaining the decompressor outputs to deliver the identical value during the next shift cycle.

As mentioned early, two new features of the disclosed technology further help to obtain a high degree of test compression. First, a small set of scan chains receive a full toggle stimulus, and a different test patterns can dynamically select different sets of full toggle scan chains. This prevents scenarios where certain faults escape detection (leading to a coverage drop) because they need more frequent changes in a given scan chain than the hold-toggle mode could permit. Second, a short hold-toggle pattern repeating multiple times, rather than a full length hold-toggle template, is employed to control scan chains operating in the hold-toggle mode. In many cases, the short hold-toggle pattern can be less than 32 bits. Because of its size, a hold-toggle pattern can be deployed for any number of test patterns, including a single vector. This is because an update of a small test template register requires no additional patterns and/or ATE channels, and time needed to do this is a negligible fraction of a regular test pattern upload period. The dynamically changeable hold-toggle pattern makes ATPG and/or encoding more flexible and thus high compression feasible.

The disclosed technology can also achieve the benefits of low shift-power and high compression without significantly increasing test logic silicon real estate. As shown above, test logic (HTL) according to some embodiments of the disclosed technology can be implemented using one hold latch and one 3-input OR gate per a single bit of a ring generator. Furthermore, it comprises a template register, typically a 32-bit or smaller device, two login-bit full toggle registers, where n is the number of scan chains, and two 1-out-of-n decoders using a certain number (depending on n) of 5-input AND gates and inverters. FIG. 6 shows a table of the silicon real estate taken up by HTL in terms of equivalent area of 2-input NAND gates (measured also in $mm^2$) for 4 industrial circuits (C1-C4). The presented numbers are computed with a commercial synthesis tool for four industrial circuits. All components of the test logic are synthesized using a 65 nm CMOS standard cell library under 2.5 ns timing constraint. The table reports the following quantities: the resultant silicon area with respect to combinational and sequential devices for conventional scan-based designs (the first three columns), the total area taken by circuits with on-chip EDT-based test compression, and then the percentage area increase ($\Delta E$). Subsequently, the total HTL-based area is presented and compared with the corresponding area occupied by conventional scan-based designs ($\Delta H$). The results do not account for a routing cost, however. Except for two signals to control template and full toggle registers, it remains similar to that of the conventional scan. As can be seen, the resultant area is comparable to other scan-based DFT methods. Testing with power constraints typically needs additional hardware for: activating a high-speed scan enable signal, moderating di/dt through a scan burst capability, gating scan cells to reduce power dissipation during shift, and gating scan out signal to reduce the power consumption during normal operations. Having the HTL logic on a chip may result in slightly more complicated designs with respect to the placement and routing, but, in turn, the disclosed technology can further reduce test data volume and power consumption, allowing for more efficient handling of new types of defects.

Test Pattern Generation Tool

Figure 7:
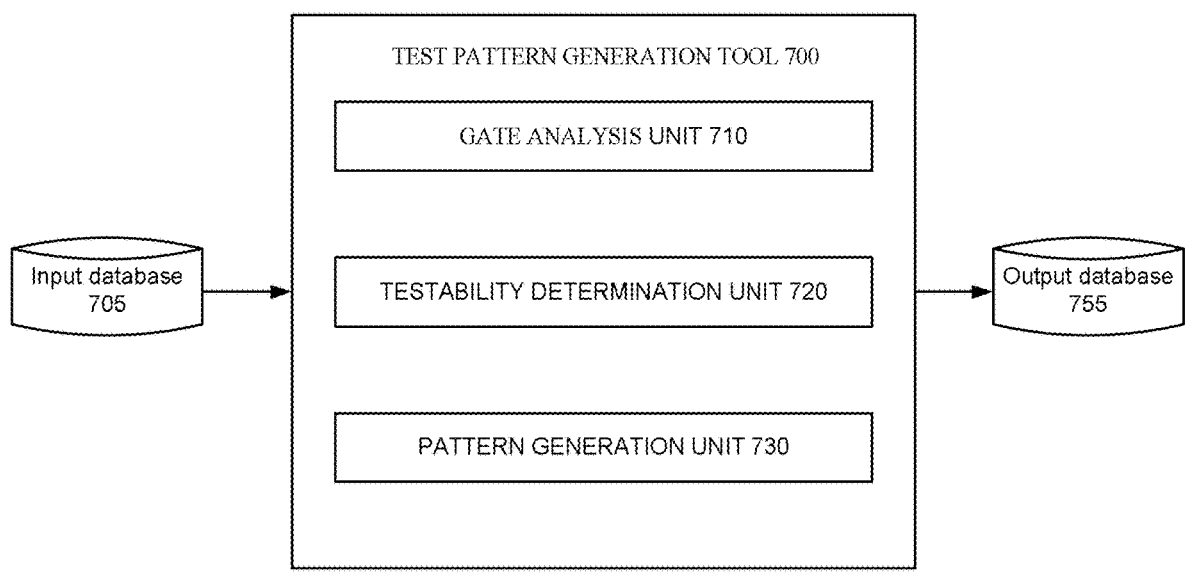
FIG. 7 illustrates an example of a test pattern generation tool 700 that may be implemented according to various embodiments of the disclosed technology.

FIG. 7 illustrates an example of a test pattern generation tool 700 that may be implemented according to various embodiments of the disclosed technology. As seen in this figure, the test pattern generation tool 700 includes a gate analysis unit 710, a testability determination unit 720, and a pattern generation unit 730. Some implementations of the test pattern generation tool 700 may cooperate with (or incorporate) one or both of an input database 705 and an output database 755.

As will be discussed in more detail below, the gate analysis unit 710 determines constant-output-value gates and buffer gates for gates in a circuit design based on a hold-toggle pattern. The circuit design and the hold-toggle pattern may be received from the input database 705. The hold-toggle pattern determines in which shift clock cycles in a segment of consecutive shift clock cycles one or more scan chains receive bits based on corresponding bits of a test pattern or bits same as bits of previous shift clock cycles during a shift operation. The testability determination unit 720 determines activation probabilities and observation probabilities for circuit nodes of the circuit design based at least in part on the constant-output-value gates and the buffer gates. The pattern generation unit 730 generates test patterns based on the activation probabilities and the observation probabilities. The generated test patterns may be stored in the output database 755.

As previously noted, various examples of the disclosed technology may be implemented by one or more computing systems, such as the computing system illustrated in FIG. 1. Accordingly, one or more of the gate analysis unit 710, the testability determination unit 720, and the pattern generation unit 730 may be implemented by executing programming instructions on one or more processors in one or more computing systems, such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or more of the gate analysis unit 710, the testability determination unit 720, and the pattern generation unit 730. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the gate analysis unit 710, the testability determination unit 720, and the pattern generation unit 730 are shown as separate units in FIG. 7, a single computer (or a single processor within a master computer) or a single computer system may be used to implement some or all of these units at different times, or components of these units at different times.

With various examples of the disclosed technology, the input database 705 and the output database 755 may be implemented using any suitable computer readable storage device. That is, either of the input database 705 and the output database 755 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 705 and the output database 755 are shown as separate units in FIG. 7, a single data storage medium may be used to implement some or all of these databases.

Test Pattern Generation Based on Isometric Guidance

Figure 8:
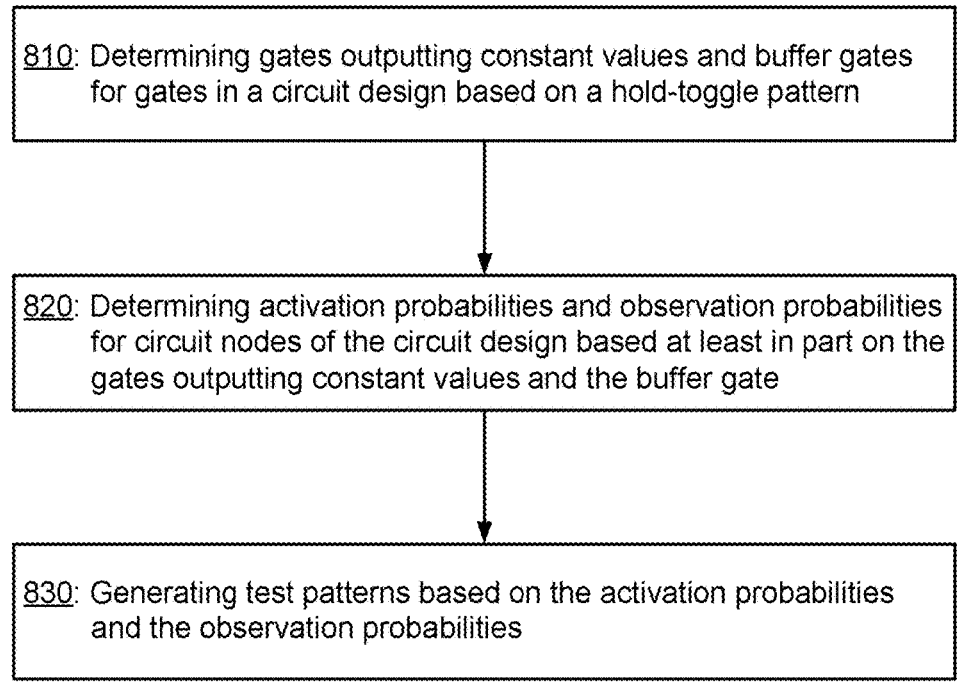
FIG. 8 illustrates a flowchart showing a process of test pattern generation based on isometric guidance that may be implemented according to various examples of the disclosed technology.

FIG. 8 illustrates a flowchart 800 showing a process of test pattern generation based on isometric guidance that may be implemented according to various examples of the disclosed technology. For ease of understanding, methods of test pattern generation based on isometric guidance that may be employed according to various embodiments of the disclosed technology will be described with reference to the test pattern generation tool 700 in FIG. 7 and the flow chart 800 illustrated in FIG. 8. It should be appreciated, however, that alternate implementations of a test pattern generation tool may be used to perform the methods of test pattern generation based on isometric guidance illustrated by the flow chart 800 according to various embodiments of the disclosed technology. Likewise, the test pattern generation tool 700 may be employed to perform other methods of test pattern generation based on isometric guidance according to various embodiments of the disclosed technology.

In operation 810, the gate analysis unit 710 determines constant-output-value gates and buffer gates for gates in a circuit design based on a hold-toggle pattern. The circuit design may have a test system illustrated by the test compression system 200 shown in FIG. 2 or other test systems having hold segments of scan cells during a test. A hold segment is a segment of consecutive scan cells on a scan chain loaded with the same value after a test pattern shifted into the scan chain. A scan chain can have consecutive hold segments with loaded values alternating between "1" and "0". Each of the constant-output-value gates represents one or more gates in the circuit design; and each of the buffer gates represents one or more gates in the circuit design. A constant-output-value gate is a gate outputting a constant value, either "1" or "0". The hold-toggle pattern determines in which shift clock cycles in a segment of consecutive shift clock cycles one or more scan chains receive bits based on corresponding bits of a test pattern or same bits as bits of previous shift clock cycles during a shift operation. In effect, the hold-toggle pattern determines boundaries for each of the hold segments. The information of the hold-toggle pattern can be stored, for example, in the second storage circuitry 213 during a test when the test compression system 200 is used.

In the examples illustrated by FIGS. 3 and 4, hold-toggle scan chains in an isometric-base test system have consecutive hold segments according to the hold-toggle pattern. The hold-toggle pattern repeats itself multiple times. It should be noted that the disclosed technology can be applied to test pattern generation for systems where the hold-toggle pattern does not repeat.

Figure 9:
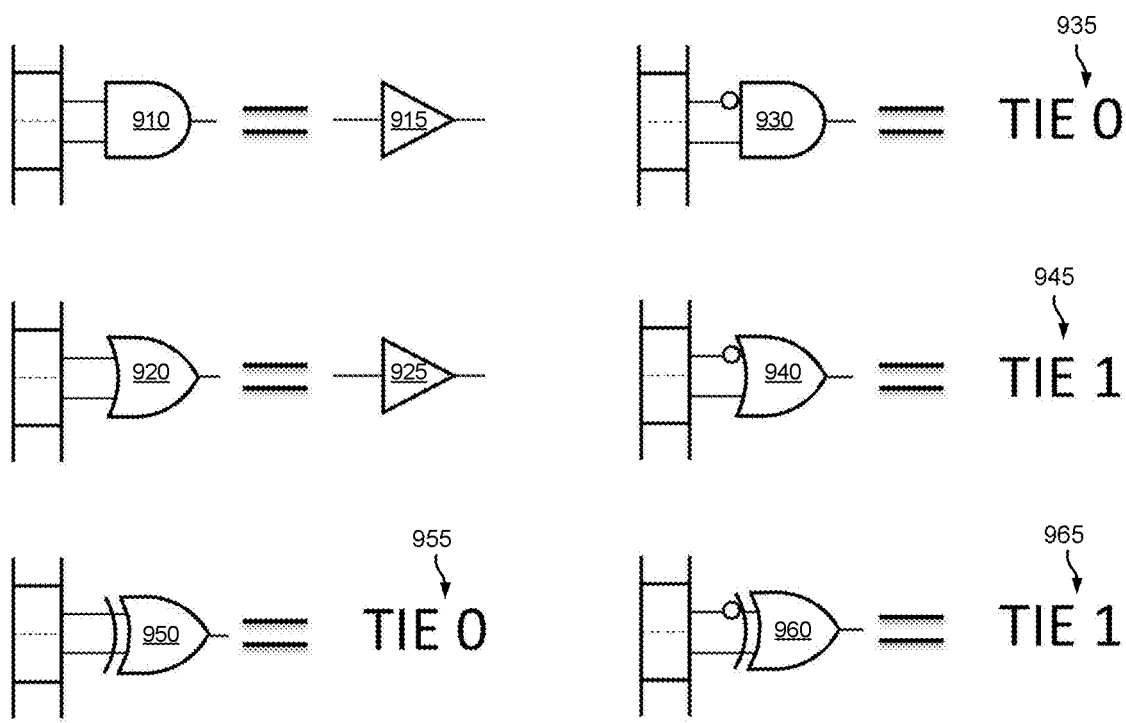
FIG. 9 illustrates examples of logic gates with inputs directly connected to a hold segment and the corresponding constant-output-value gates and buffer gates for them.

The information of these hold segments can be used to guide the test pattern generation for isometric-based tests, thereby speeding up the process, increasing test coverage, and/or increasing test compression ratio. FIG. 9 illustrates examples of logic gates with inputs directly connected to a hold segment and the corresponding constant-output-value gates and buffer gates for them. With both of its inputs connected to the same value, an AND gate 910 can output only that value and thus can be represented by a buffer gate 915. Similarly, an OR gate 920 can be represented by a buffer gate 925. An AND gate 930 and an OR gate 940 both have one of their two inputs receiving scan cell data through an inverter. As such, constant-output-value gates 935 (TIE 0) and 945 (TIE 1) can be used to represent them, respectively. For XOR gates 950 and 960, only constant-output-value gates 955 (TIE 0) and 965 (TIE 1) can be used, respectively, no matter whether an inverter is present or not. It should be noted that these equivalent gates can be applied to gates with their inputs connected to not only the same hold segments but also different hold segments with the same hold values on the same scan chain.

Figure 10:
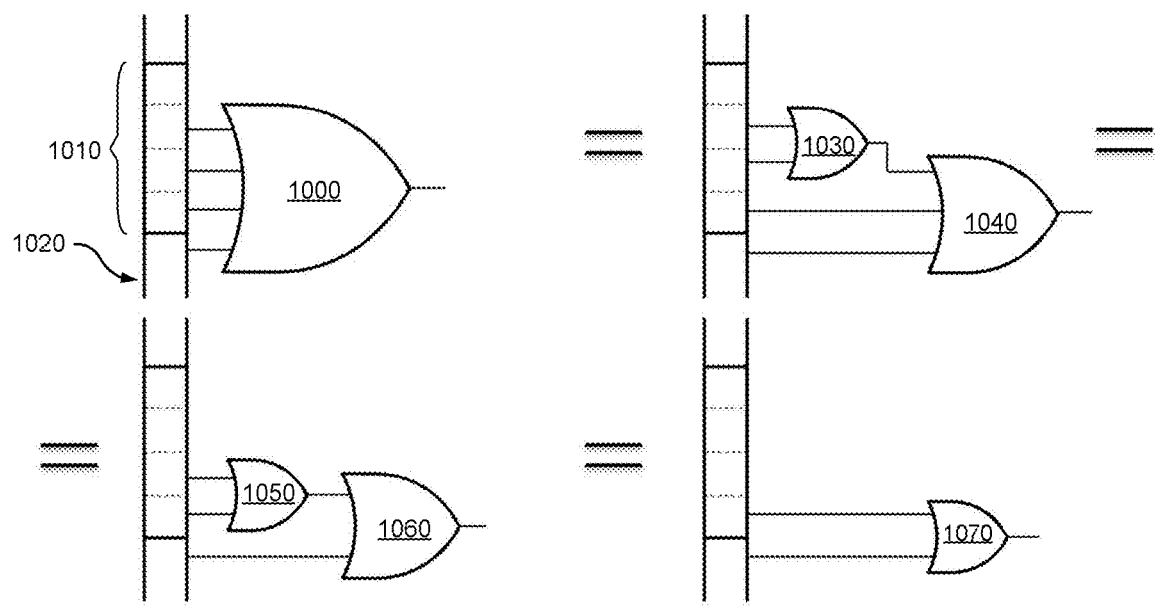
FIG. 10 illustrates an example of a logic gate with inputs directly connected to different hold segments.

FIG. 10 illustrates an example of a logic gate 1000 with inputs directly connected to different hold segments. The logic gate 1000 has four inputs, of which three are connected to one hold segment 1010 and the other is connected to a different hold segment 1020. First, the gate 1000 can be represented by a two-input OR gate 1030 and a three input OR gate 1040. Then, the OR gates 1030 and 1040 can be substituted with two two-input gates 1050 and 1060, which can be represented by a single OR gate 1070. If the hold segments 1010 and 1020 are next to each other as shown in the figure or have opposite values, the equivalent gate is a constant-output-value gate like the gate 945 in FIG. 9. Otherwise, the equivalent gate is a buffer gate like gate 925 in FIG. 9.

Figure 11:
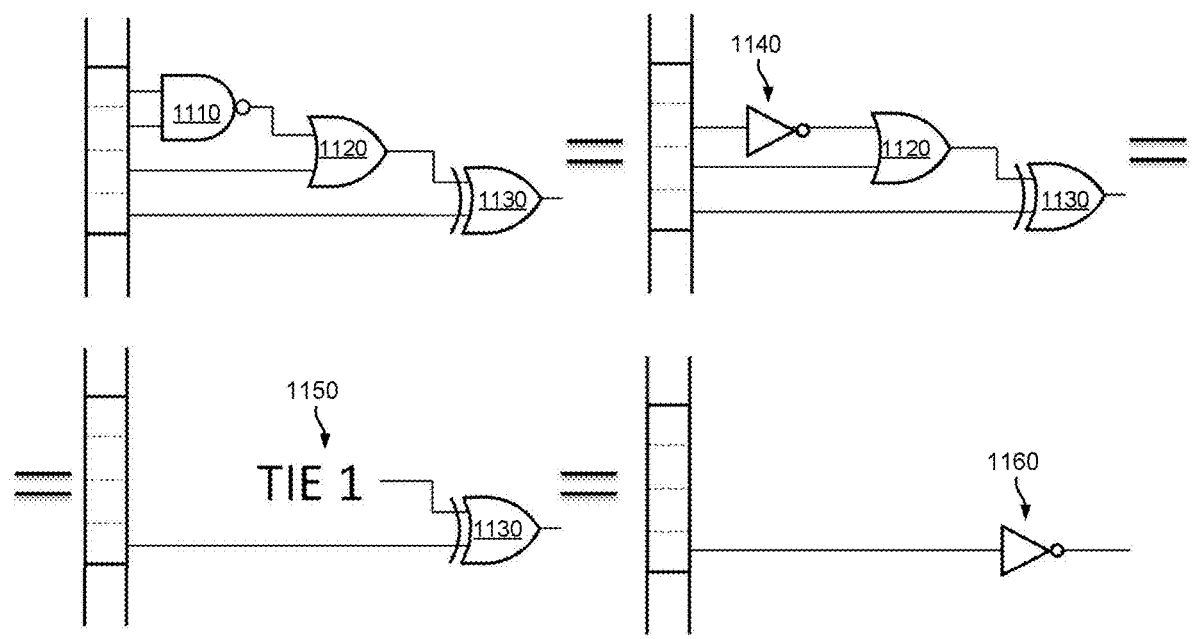
FIG. 11 illustrates an example of representing multiple gates with a single constant-output-value gate or a buffer gate.

FIG. 11 illustrates an example of representing multiple gates with a single constant-output-value gate or a buffer gate. The figure shows three logic gates 1110, 1120 and 1130 with all of their inputs directly or indirectly connected to scan cells of the same segment. The AND gate 1110 can first be represented by a buffer gate 1140. The buffer gate 1140 supplies a signal to the OR gate 1120 opposite to the other input signal. As a result, the buffer gate 1140 and the OR gate 1120 can be represented by a constant-output-value gate 1150 with its output fixed at 1. Having a constant "1" at one of its input, the XOR gate 1130 becomes a buffer gate 1160. Therefore, the buffer gate 1160 can be used to represent the original three gates 1110, 1120 and 1130.

Figure 12:
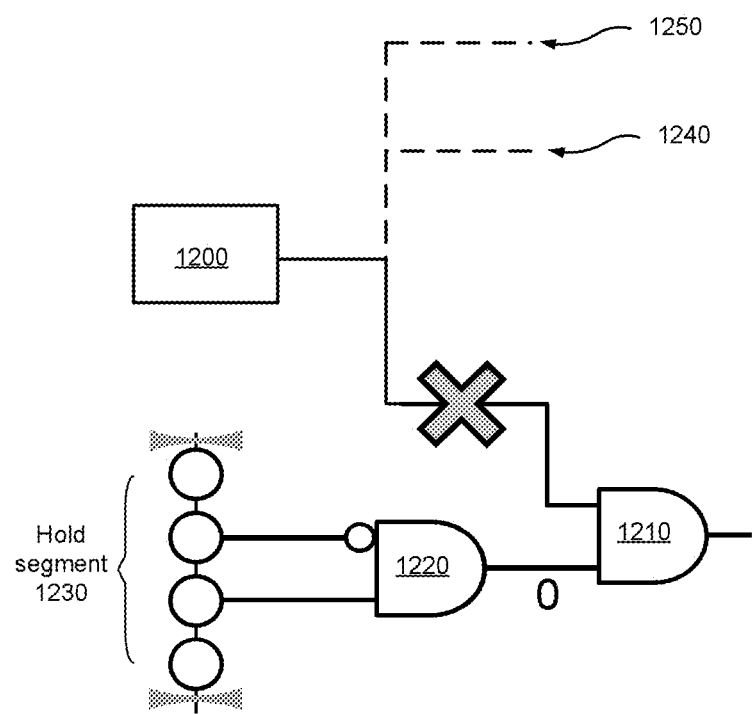
FIG. 12 illustrates an example of a blocked gate.

According to some embodiments of the disclosed technology, the determination of constant-output-value gates and buffer gates may start with identifying blocked gates. A blocked gate is a logic gate of which the output is blocked by one or more other logic gates and cannot reach an observation point (a scan cell or a primary output). FIG. 12 illustrated an example of a blocked gate 1200. The blocked gate 1200 can be any logic gate such as AND gate, OR gate and XOR gate. Its output is directly connected to one of the two inputs of an AND gate 1210. The other input of the AND gate 1210 is connected to the output of an AND gate 1220. Both inputs of the AND gate 1220 are connected to scan cells in a hold segment 1230, one directly and the other through an inverter. Under such a configuration, the AND gate 1220 always outputs a constant value "0" no matter what values are stored in the scan cells like the AND gate 930 in FIG. 9. Because "0" is a control value for the AND gate 1210, the output of the gate 1200 is blocked on this path because the AND gate 1210 will always output a constant value "0". If it has no fan-out, then the gate 1200 is a blocked gate. If its output has other paths such as 1240 and 1250, then the gate 1200 is a blocked gate only when every path is blocked. An output signal propagation path of a blocked gate can be blocked by a gate directly coupled to the output of the blocked gate like the AND gate 1210 or by a gate with its input coupled to the output of the blocked gate through one or more other gates.

Figure 13:
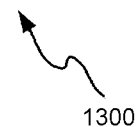
FIG. 13 illustrates an example of a pseudo code for determining blocked gates which may be implemented by various embodiments of the disclosed technology.

FIG. 13 illustrates an example of a pseudo code 1300 for determining blocked gates which may be implemented by various embodiments of the disclosed technology. The code 1300 does not show two logic simulations, one having a given hold-segment being loaded with "1" and the other with "0". If both simulations indicate that its output is blocked, a gate will be a blocked gate. The observability of such a gate is zero.

Figure 14:
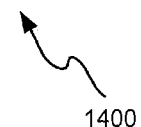
FIG. 14 illustrates an example of a pseudo code for determining constant-output-value gates and buffer gates which may be implemented by various embodiments of the disclosed technology.

FIG. 14 illustrates an example of a pseudo code 1400 for determining constant-output-value gates and buffer gates which may be implemented by various embodiments of the disclosed technology. The code 1400 uses the code 1300 to find blocked gates ($G_1$) due to asserted scan cells (loaded with "1s") and blocked gates ($G_0$) due to de-asserted scan cells(loaded with "0s") first. Then, the code 1400 compares a gate outputs in the two simulations to determine constant-output-value gates and buffer gates. If it outputs the same value in both of the simulations, a gate can be represented by a constant-output-value gate. Otherwise, it is a buffer gate.

Refer back to the flowchart 800. In operation 820, the testability determination unit 720 determines activation probabilities and observation probabilities for circuit nodes of the circuit design based at least in part on the constant-output-value gates and the buffer gates. To be detected, a fault need to be both activated and observed. As discussed previously, fault activation establishes a signal value at the fault site opposite that produced by the fault by specifying values for one or more scan cells (may including primary input(s)); and fault propagation propagates the fault effect forward by sensitizing a path from a fault site to a scan cell or a primary output. The fault activation path and the fault observation path are often decided "randomly" by a conventional ATPG tool: if there is a fan-out, a random number generator may be employed, for example, to choose which path to be selected. In an isometric-based pattern generation, however, many signal paths may be blocked due to the existence of many hold segments, and many gates can be represented by either a constant-output-value gate or a buffer gate. These constrains can be employed to guide the pattern generation through the determination of activation probabilities and observation probabilities according to various embodiments of the disclosed technology.

Figure 15:
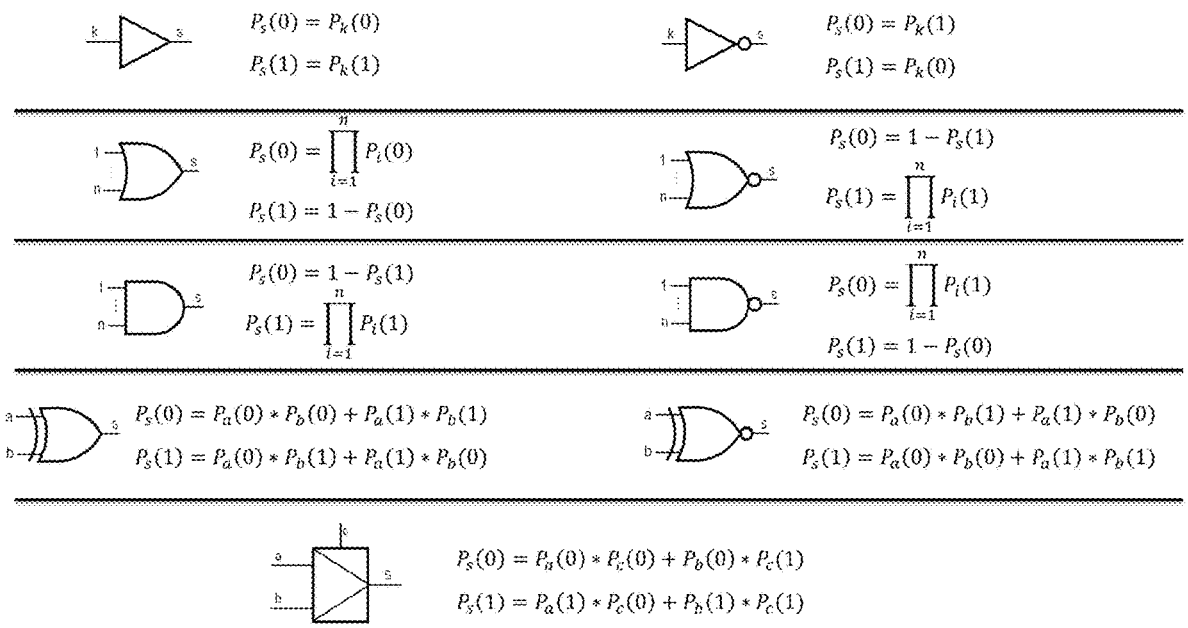
FIG. 15 illustrates an example of determining activation probabilities of some basic logic gates.

FIG. 15 illustrates an example of determining activation probabilities of some basic logic gates. For example, the probability of establishing a value of "0" at the output of an OR gate is equal to a product of the probabilities of establishing a value of "0" at each of the inputs of the OR gate. The probability of establishing a value of "1" at the output of an OR gate is equal to one minus the probabilities of establishing a value of "0". Starting from scan cells and maybe primary inputs, the activation probabilities for circuit nodes (probabilities of establishing values of "1" and "0", respectively) can be obtained.

Figure 16:
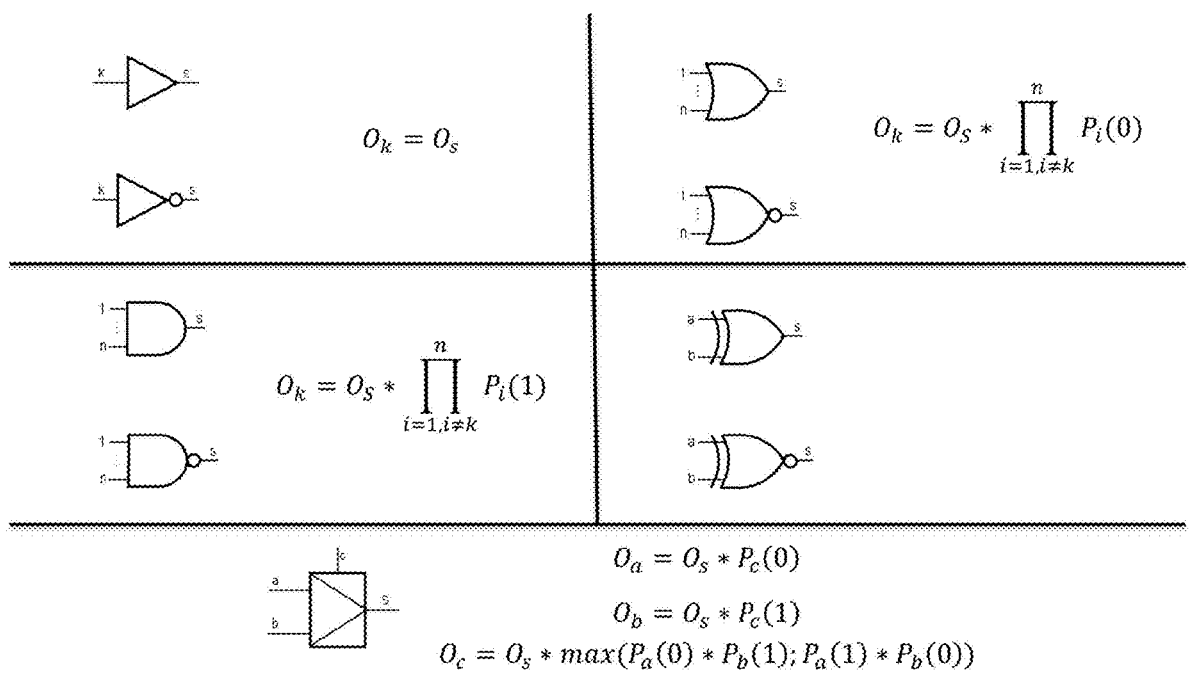
FIG. 16 illustrates an example of determining observation probabilities of some basic logic gates.

FIG. 16 illustrates an example of determining observation probabilities of some basic logic gates. For example, the probability of propagating a value of "0" or "1" at one of the inputs of an OR gate is equal to the probability of propagating a value of "0" or "1" at its output times the product of establishing a value "1" at all of its inputs except the input of which the value needs to be propagated. Starting from a fault site, the observation probability can be obtained by establishing a signal path to a scan cell or an output. If there are more than one signal paths, the observation probability may be decided based on the one providing the largest value. The information of the constant-output-value gates and the buffer gates can significantly speed up the process of determining activation probabilities and observation probabilities.

Refer back to the flowchart 800. In operation 830, the pattern generation unit 730 generates test patterns based on the activation probabilities and the observation probabilities. The generating test patterns may comprise generating compressed test patterns such as generating EDT-encoded patterns. There are various ways for the pattern generation unit 730 to utilize information of the activation probabilities and the observation probabilities. For example, the pattern generation unit 730 may reorder the list of faults based on the testability for each of the faults for generating patterns. The testability can be calculated by adding the corresponding activation probability and the corresponding observation probability, for instance. Generating test patterns for the faults having larger testability values first may help with reducing pattern counts and/or increasing the compression ratio. According to some embodiments of the disclosed technology, original testability values of the faults without considering the hold-toggle pattern are determined. New testability values of the faults are determined based on the activation probabilities and the observation probabilities. A new sequence of faults for test cube generation can then be determined based on comparing the first testability values with the second testability values. Additionally or alternatively, the pattern generation unit 730 may select the activation path based on the activation probabilities and the observation path based on the observation probabilities. These ATPG decisions (including justification and observation) can affect the quality and size of generated patterns. This may lead to quicker pattern generation time, smaller pattern counts, higher compression ratios, or any combination thereof.

Conclusion

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
   determining constant-output-value gates and buffer gates for gates in a circuit design based on a repeating hold-toggle pattern, wherein each of the constant-output-value gates represents one or more gates in the circuit design, each of the buffer gates represents one or more gates in the circuit design, and the hold-toggle pattern determines in which shift clock cycles in a segment of consecutive shift clock cycles one or more scan chains receive bits based on corresponding bits of a test pattern or same bits as bits of previous shift clock cycles during a shift operation;
   determining activation probabilities and observation probabilities for circuit nodes of the circuit design based at least in part on the constant-output-value gates and the buffer gates;
   generating test patterns based on the activation probabilities and the observation probabilities, including using the activation probabilities and the observation probabilities as guidance for determining fault activation and propagation paths.

2. The method recited in claim 1, wherein the generating test patterns also comprises:
   reordering faults based on the activation probabilities and the observation probabilities.

3. The method recited in claim 2, wherein the reordering faults comprises:
   determining first testability values of the faults without considering the hold-toggle pattern;
   determining second testability values of the faults based on the activation probabilities and the observation probabilities; and
   changing a sequence of faults for test cube generation based on comparing the first testability values with the second testability values.

4. The method recited in claim 1, wherein the determining constant-output-value gates and buffer gates comprises:
   determining blocked gates in the circuit design based on the hold-toggle pattern.

5. The method recited in claim 1, wherein the generating test patterns also comprises generating compressed test patterns.

6. The method recited in claim 5, wherein the compressed test patterns are test patterns encoded for EDT (embedded deterministic test)-based decompressors.

7. One or more non-transitory computer-readable media storing computer-executable instructions for causing one or more processors to perform a method, the method comprising:
   determining constant-output-value gates and buffer gates for gates in a circuit design based on a repeating hold-toggle pattern, wherein each of the constant-output-value gates represents one or more gates in the circuit design, each of the buffer gates represents one or more gates in the circuit design, and the hold-toggle pattern determines in which shift clock cycles in a segment of consecutive shift clock cycles one or more scan chains receive bits based on corresponding bits of a test pattern or same bits as bits of previous shift clock cycles during a shift operation;
   determining activation probabilities and observation probabilities for circuit nodes of the circuit design based at least in part on the constant-output-value gates and the buffer gates; and
   generating test patterns based on the activation probabilities and the observation probabilities, including using the activation probabilities and the observation probabilities as guidance for determining fault activation and propagation paths.

8. The one or more non-transitory computer-readable media recited in claim 7, wherein the generating test patterns also comprises:
   reordering faults based on the activation probabilities and the observation probabilities.

9. The one or more non-transitory computer-readable media recited in claim 8, wherein the reordering faults comprises:
   determining first testability values of the faults without considering the hold-toggle pattern;
   determining second testability values of the faults based on the activation probabilities and the observation probabilities; and
   changing a sequence of faults for test cube generation based on comparing the first testability values with the second testability values.

10. The one or more non-transitory computer-readable media recited in claim 7, wherein the determining constant-output-value gates and buffer gates comprises:
    determining blocked gates in the circuit design based on the hold-toggle pattern.

11. The one or more non-transitory computer-readable media recited in claim 7, wherein the generating test patterns also comprises generating compressed test patterns.

12. The one or more non-transitory computer-readable media recited in claim 11, wherein the compressed test patterns are test patterns encoded for EDT (embedded deterministic test)-based decompressors.

13. A system, comprising:
one or more processors, the one or more processors programmed to perform a method, the method comprising:
determining constant-output-value gates and buffer gates for gates in a circuit design based on a repeating hold-toggle pattern, wherein each of the constant-output-value gates represents one or more gates in the circuit design, each of the buffer gates represents one or more gates in the circuit design, and the hold-toggle pattern determines in which shift clock cycles in a segment of consecutive shift clock cycles one or more scan chains receive bits based on corresponding bits of a test pattern or same bits as bits of previous shift clock cycles during a shift operation;
determining activation probabilities and observation probabilities for circuit nodes of the circuit design based at least in part on the constant-output-value gates and the buffer gates; and
generating test patterns based on the activation probabilities and the observation probabilities, including using the activation probabilities and the observation probabilities as guidance for determining fault activation and propagation paths.

14. The system recited in claim 13, wherein the generating test patterns also comprises:
reordering faults based on the activation probabilities and the observation probabilities.

15. The system recited in claim 14, wherein the reordering faults comprises:
determining first testability values of the faults without considering the hold-toggle pattern;
determining second testability values of the faults based on the activation probabilities and the observation probabilities; and
changing a sequence of faults for test cube generation based on comparing the first testability values with the second testability values.

16. The system recited in claim 13, wherein the determining constant-output-value gates and buffer gates comprises:
determining blocked gates in the circuit design based on the hold-toggle pattern.

17. The system recited in claim 13, wherein the generating test patterns also comprises generating compressed test patterns.

18. The system recited in claim 17, wherein the compressed test patterns are test patterns encoded for EDT (embedded deterministic test)-based decompressors.

* * * * *